United States Patent
Bacchus et al.

(10) Patent No.: US 10,504,578 B2
(45) Date of Patent: Dec. 10, 2019

(54) VOLATILE MEMORY DEVICE WITH AUTOMATIC LOWER POWER STATE

(71) Applicant: HEWLETT PACKARD ENTERPRISE DEVELOPMENT LP, Houston, TX (US)

(72) Inventors: Reza M Bacchus, Spring, TX (US); Melvin K Benedict, Magnolia, TX (US); Eric L Pope, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/768,536

(22) PCT Filed: Oct. 25, 2015

(86) PCT No.: PCT/US2015/057268
§ 371 (c)(1),
(2) Date: Apr. 13, 2018

(87) PCT Pub. No.: WO2017/074292
PCT Pub. Date: May 4, 2017

(65) Prior Publication Data
US 2018/0301183 A1    Oct. 18, 2018

(51) Int. Cl.
| G11C 11/406 | (2006.01) |
| G11C 5/14 | (2006.01) |
| G11C 7/20 | (2006.01) |
| G11C 11/4072 | (2006.01) |
| G11C 11/4076 | (2006.01) |
| G11C 11/4074 | (2006.01) |

(52) U.S. Cl.
CPC ......... *G11C 11/40615* (2013.01); *G11C 7/20* (2013.01); *G11C 11/4072* (2013.01); *G11C 11/4076* (2013.01); *G11C 5/144* (2013.01); *G11C 11/406* (2013.01); *G11C 11/4074* (2013.01); *G11C 2207/2227* (2013.01); *G11C 2211/4067* (2013.01)

(58) Field of Classification Search
CPC ............ G11C 5/144; G11C 2207/2227; G11C 11/406
USPC .................................................. 365/222, 227
See application file for complete search history.

(56) References Cited

U.S. PATENT DOCUMENTS

| 5,127,014 A | 6/1992 | Raynham |
| 5,446,695 A | 8/1995 | Douse et al. |
| 6,349,390 B1 | 2/2002 | Dell et al. |

(Continued)

FOREIGN PATENT DOCUMENTS

| WO | WO-2017065802 | 4/2017 |

OTHER PUBLICATIONS

Balasubramanya Bhat, "Making DRAM Refresh Predictable," Jul. 1, 2010, Euromicro Conference on Real-Time Systems, pp. 145-154.

(Continued)

*Primary Examiner* — Son L Mai
(74) *Attorney, Agent, or Firm* — Hewlett Packard Enterprise Patent Department

(57) ABSTRACT

A volatile memory device includes a memory array of volatile charge storage cells, a counter to track a time since the volatile memory device has received a read/write command and a control element to automatically change the volatile memory device to a lower power state based on the time tracked by the counter.

12 Claims, 3 Drawing Sheets

(56) References Cited

U.S. PATENT DOCUMENTS

| | | | |
|---|---|---|---|
| 6,707,744 B2 | 3/2004 | Jo | |
| 6,941,415 B1 | 9/2005 | Ryan | |
| 7,099,234 B2 * | 8/2006 | Parris | G11C 5/144 365/222 |
| 7,177,220 B2 | 2/2007 | Chou et al. | |
| 7,343,502 B2 | 3/2008 | Samson et al. | |
| 7,437,579 B2 * | 10/2008 | Jeddeloh | G06F 1/206 713/300 |
| 7,739,461 B2 * | 6/2010 | Hur | G06F 1/3225 711/158 |
| 8,161,356 B2 | 4/2012 | Bains et al. | |
| 8,938,589 B2 | 1/2015 | Muralimanohar et al. | |
| 9,042,196 B2 * | 5/2015 | Tanaka | G11C 16/30 365/227 |
| 9,818,458 B1 * | 11/2017 | Jayachandran | G11C 5/147 |
| 2003/0009721 A1 | 1/2003 | Hsu | |
| 2004/0243886 A1 | 12/2004 | Klein | |
| 2006/0206738 A1 | 9/2006 | Jeddeloh et al. | |
| 2008/0082766 A1 | 4/2008 | Okin | |
| 2008/0177929 A1 | 7/2008 | Gower | |
| 2009/0019243 A1 | 1/2009 | Hur et al. | |
| 2009/0144506 A1 | 6/2009 | Barth, Jr. et al. | |
| 2011/0022873 A1 | 1/2011 | Drexler | |
| 2011/0138387 A1 | 6/2011 | Ahn et al. | |
| 2012/0317352 A1 | 12/2012 | Kang et al. | |
| 2013/0139008 A1 | 5/2013 | Kalyanasundharam | |
| 2014/0281810 A1 | 9/2014 | Gifford et al. | |
| 2017/0185320 A1 | 6/2017 | Krause | |

OTHER PUBLICATIONS

Intel Enterprise Platforms and Services Division, Intel Server Board S5500BC—Technical Product Specification, Revision 1.8, Jun. 2011 (162 pages).

Intel White Paper, The Intel Xeon Processor 7500 Series, Advanced Reliability for Intel Xeon Processor-based Servers, Version 1.0, Mar. 2010 (12 pages).

Manu Awasthi, "Efficient Scrub Mechanisms for Error-Prone Emerging Memories," High Performance Computer Architecture, IEEE 18th Int'l Symposium, Feb. 25-29, 2012, 12 pages.

PCT/ISA/KR, International Search Report and Written Opinion, dated Jul. 25, 2016, PCT/US2015/057268, 12 pages.

PCT/ISA/KR, International Search Report and Written Opinion, dated Jul. 15, 2016, PCT/US2015/055976, 11 pages.

* cited by examiner

VOLATILE MEMORY DEVICE WITH AUTOMATIC LOWER POWER STATE

BACKGROUND

Volatile memory devices, such as dynamic random access memory devices, maintain stored data while the storage devices are being electrically powered. The electric power is utilized to refresh the stored data. Some volatile memory devices refresh data several times every second. To reduce power consumption, memory controllers sometimes transmit commands to the volatile memory devices, across a command bus, directing the volatile memory device to enter a lower power state.

DETAILED DESCRIPTION

Volatile memory devices, such as dynamic random access memory devices, are often used to temporarily store data. To maintain the stored data, the volatile memory devices consume electrical power. To reduce power consumption, memory controllers sometimes transmit commands to the volatile memory devices, across a command bus, directing the volatile memory device to enter a lower power state. Such commands increase traffic on the command bus, consuming valuable bandwidth.

Figure 1:
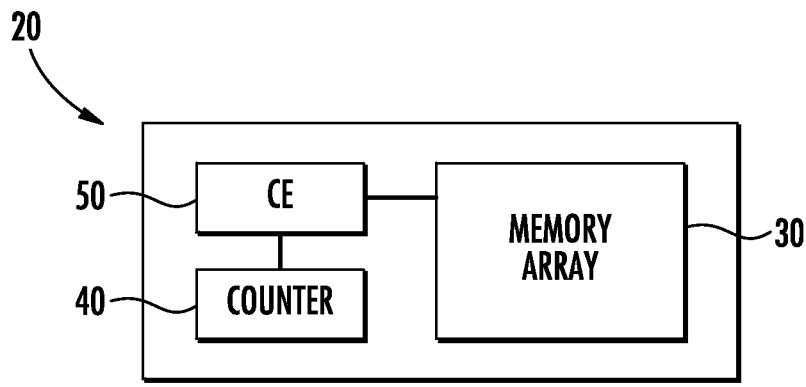
FIG. 1 is a schematic diagram of an example volatile memory device.

FIG. 1 is a schematic diagram of an example volatile memory device 20. Volatile memory device 20 automatically changes to a lower power state in response to signals from a local command element. As a result, traffic across the command bus between the memory controller and the volatile memory device 20 is reduced. Moreover, management tasks for the memory controller are reduced.

Volatile memory device 20 comprises memory array 30, counter 40 and control element 50. Memory array 30 comprises an array of volatile charge storage cells. Such storage cells temporarily store data, wherein the data is periodically refreshed. One example of memory array 30 is a dynamic random access memory array. In other implementations, memory array 30 may comprise other presently developed or future developed volatile memory arrays such as those comprising spin transfer torque memory arrays.

Counter 40 comprises a component, incorporated as part of memory device 20, that tracks a time or a lapse of time since the volatile memory device 20 last received a read or write command, such as a last time that device 20 received a read or write command from a memory controller. In one implementation, counter 240 comprises a decay counter which counts down from a predetermined value, control element 50 is triggered to initiate a lower power state in response to the decay counter counting down to a predetermined value, such as zero. In another implementation, counter 40 comprises an incremental counter which increases in value as time passes since receipt of a last access command (read or write command) from a memory controller, wherein control element 50 is triggered to initiate a lower power state in response to the value of the counter meeting or surpassing a predefined threshold.

Control element 50 comprises a processing unit that follows instructions contained in a non-transient computer-readable medium. For purposes of this application, the term "processing unit" shall mean a presently developed or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, control element 50 may be embodied as part of one or more application-specific integrated circuits (ASICs). Unless otherwise specifically noted, the controller is not limited to any specific combination of hardware circuitry and software, nor to any particular source for the instructions executed by the processing unit.

Figure 2:
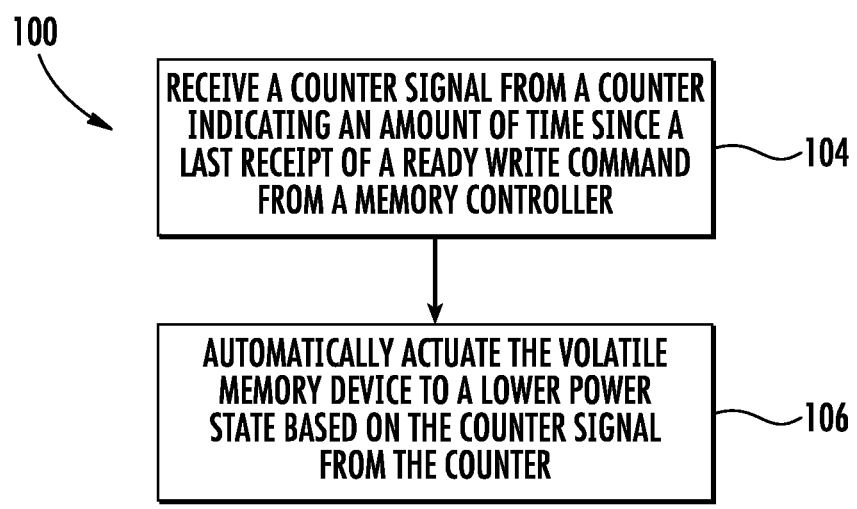
FIG. 2 is a flow diagram of an example method for changing power states of a volatile memory device.

Control element 50, following such instructions, carries out the example energy conserving method 100 set forth in FIG. 2. As indicated by block 104, control element 50 receives a counter signal from a counter, such as counter 40, indicating an amount of time since a last receipt of a read or write command from a memory controller.

As indicated by block 106, control element 50 automatically changes volatile memory device 20 to a lower power state based upon the counter signal from the counter. In one implementation, the control element 50 automatically rewrites a page stored in a buffer of the array back to the memory array and deactivates the buffer, such as by deactivating read and/or write drivers of the buffer to reduce power consumption. In one implementation, control element 50 outputs control signals that automatically deactivate an external clock interface, such as a phase locked loop of the volatile memory device 20. In one implementation, control element 50 outputs control signals automatically deactivating a refresh counter of the volatile memory device 20. In yet other implementations, the control element 50 may automatically initiate other power saving protocols for volatile memory device 20 in response to the counter signal.

Figures 3, 4:
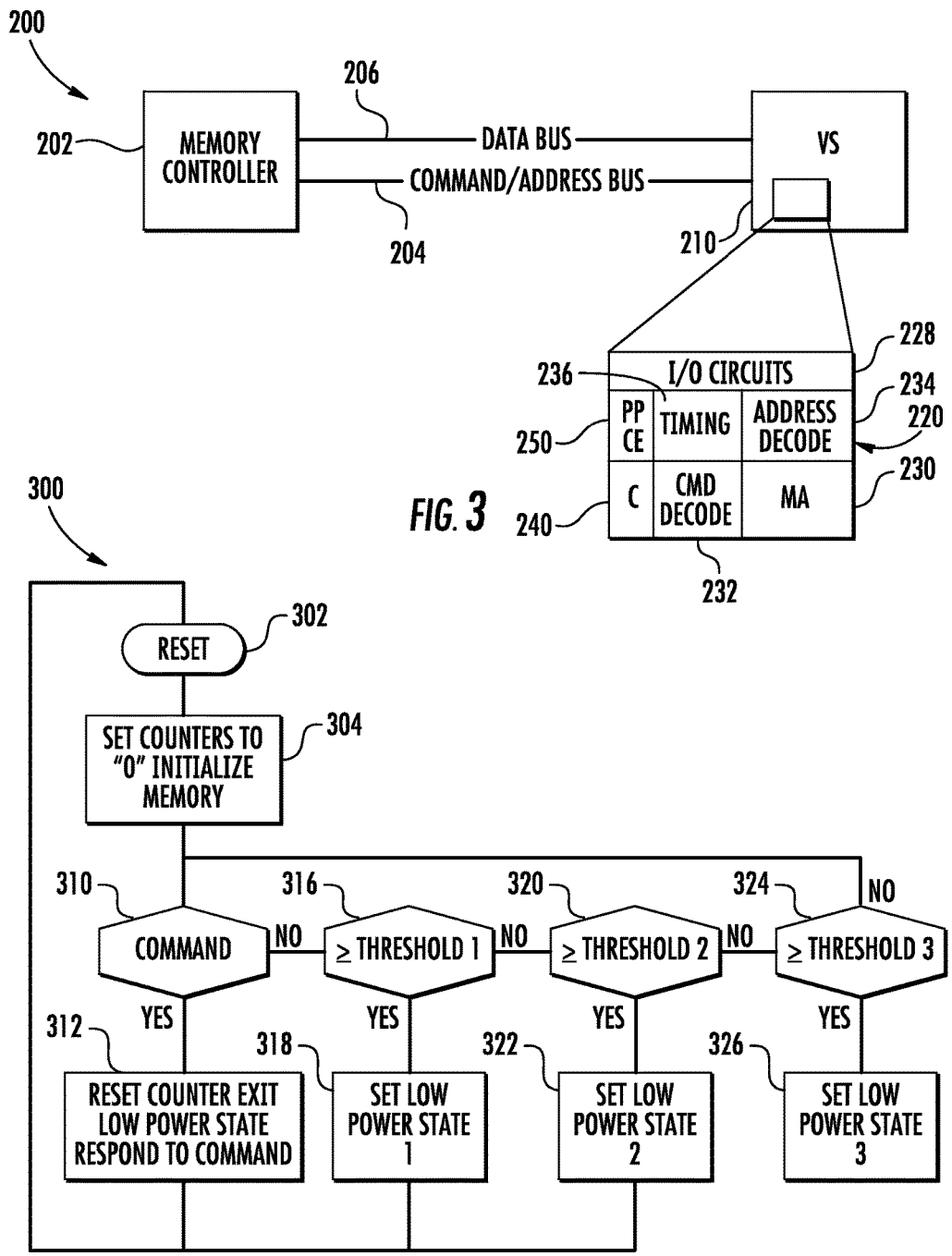
FIG. 3 is a schematic diagram of another example volatile memory device.
FIG. 4 is a flow diagram of another example method for changing power states of a volatile memory device.

FIG. 3 is a schematic diagram of an example storage system 200. Storage system 200 comprises memory controller 202, command/address bus 204, data bus 206 and volatile storage 210. Memory controller 202 comprises a device that manages the storage and retrieval of data to and from volatile storage 210. Memory controller 202 intercedes between volatile storage 210 (sometimes referred to as random access memory or RAM) and a central processing unit. In one implementation, memory controller 202 may comprise a north bridge or host chip. Memory controller 202 transmits commands and addresses for such data across command/address bus 204. The data itself may be transmitted by memory controller 202 across data bus 206 or by volatile storage 210 across the data bus 206.

Volatile storage 210 comprises a module comprising a plurality of volatile memory devices, such as the example volatile memory device 220 illustrated. As schematically shown by FIG. 3, each volatile memory device 220 comprises input output circuitry 228, a storage or memory array 230, command decode electronics 232, address decode electronics 234, refresh timing electronics 236, counter 240 and power down control element 250. Input output circuitry 228 comprises circuitry facilitating communication between buses 204, 206 and volatile memory device 220. Such circuitry may include a data-in register and a data-out register.

Memory array 230 is similar to memory array 30 described above. In one implementation, memory array 230 comprises multiple banks of arrays. In one implementation, memory array 230 comprises dynamic read access memory arrays. In such implementations, memory array 230 may additionally comprise a buffer or latches to temporarily store data read from the array or data to be written to the array. In yet other implementation, memory array 230 may comprise other presently available or future available volatile charge storage cells. In yet another implementation, memory array 230 may comprise presently available or future available non-volatile storage cells.

Command decode electronics 232, sometimes referred to as a command decoder, comprise electronics that manage access operations for memory array 230. In one implementation, command decode electronics 232 facilitate the sequencing of commands in accordance with a clock cycle time.

Address decode electronics 234 comprise electronics by which selected portions of memory array 230 are addressed and accessed in response to access operation commands from command decode electronics 232. In some implementations, address decode electronics 234 include such components as an address register, and address counter, a bank control, a row address latch and decoder, a column decoder and the like.

Refresh timer electronics 236 comprises a decay counter or other timing device establishing a refresh interval. Refresh timer electronics 236 tracks the time since the last refresh of memory array 230 and triggers a memory refresh cycle for memory array 230. In one implementation, the refreshing of memory 230 may comprise a burst refresh. In other implementations, the refresh of memory array 230 may comprise a distributed refresh. In yet other implementations, other refresh protocols for memory array 230 may be employed.

Counter 240 is similar to counter 40 described above. Counter 40 comprises a counter, clock or other timing device by which a time since the last receipt of an access command, a read or write command, has been received from memory controller 202. Counter 240 incrementally increases in value as time passes since the last receipt of an access command.

Power down control element 250 is similar to control element 50 described above. Power down control element 250 comprises a processing unit that follows instructions contained in a non-transient computer-readable medium. Power down control element 250 carries out an energy conserving method in which control element 250 automatically changes a state or operational mode of volatile memory device 220 to a lower power state or power conserving mode based upon signals from counter 240. In one implementation, power down control element 250 carries out method 100 described above. In another implementation, power down control element 250 carries out, the example method 300 illustrated in FIG. 4.

As illustrated by FIG. 4, power down control element 250, after being reset in block 302, sets counters 240 to a zero value in block 304. Thereafter, power down control element 250 operates in accordance with the remaining steps. As indicated by decision block 310, power down control element 250 determines whether an access command has been received from a memory controller, such as memory controller 202. As indicated by block 312, if a command has been received, power down control element 250 exits any low-power state, responds to the access command and returns to block 302 and 304 where the counters, such as counters 240 are once again reset to zero.

As further indicated by FIG. 4, if a command has not been received, power down control element 250 automatically proceeds to evaluate the current value of the counter 240 to various thresholds to determine whether the volatile memory device 220 should be changed to a different state, such as a lower power state or a different lower power state. In the example illustrated, in decision block 316, power down control element 250 compares the current value of counter 240 to Threshold 1. As indicated by block 318, if the current value of counter 240 meets or exceeds the predetermined Threshold 1, power down control element 250 automatically changes volatile memory device 220 to a first lower power state, Power State 1.

As indicated by block 320, if the current value of counter 240 does not satisfy Threshold 1, power down control element 250 compares the current value of counter 240 to a second threshold, Threshold 2, which is less than Threshold 1. As indicated by block 322, if the current value of counter 240 meets or exceeds the predetermined Threshold 2, power down control element 250 automatically changes volatile memory device 220 to a second lower power state, Power State 2. In one implementation, Power States 2 is less extensive, less impactful or less debilitating as compared to Power State 1.

As indicated by block 324, if the current value of counter 240 does not satisfy Threshold 2, power down control element 250 compares the current value of counter 240 to a third threshold, Threshold 3, which is less than Threshold 2. As indicated by block 326, if the current value of counter 240 meets or exceeds the predetermined Threshold 3, power down control element 250 automatically changes volatile memory device 220 to a third lower power state, Power State 3. In one implementation, Power State 3 is less extensive, less impactful or less debilitating as compared to Power States 1 and 2. If the current value of counter 240 does not satisfy Threshold 3, power down control element 250 returns to decision block 310, wherein power down control element 250 continues to monitor for the receipt of commands from memory controller 202 and wherein counter 240 continues to be incremented.

In one implementation, in Power State 3, power down control element 250 outputs control signals to automatically rewrite any page in a buffer of the memory array 230 and deactivates the buffer of the memory array 230, such as by deactivating drivers of the buffer. In Power State 2, power down control element 250 outputs control signals that automatically deactivate an external clock interface, wherein the volatile memory device 220 relies on his own internal clock or counters 236 for triggering or monitoring refresh cycles. In Power State 1, power down control element 250 outputs control signals automatically deactivating a refresh counter of the volatile memory device 220.

In yet other implementations, power down control element 250 may have a fewer or greater of such different lower power states for volatile memory device 220. For example, in other implementations, Power State 1, triggered in response to satisfaction of Threshold 1, may comprise both the deactivation of the buffers of memory array 230 as well as the deactivation of the external clock interface and/or the deactivation of the refresh counter. In yet other implementations, the control element 250 may automatically initiate other power saving protocols for volatile memory device 210 in response to the counter signal.

In one implementation, Thresholds 1, 2 and 3 are each predetermined and stored within a register other memory associated with power down control element 250. In some implementations, Thresholds 1, 2 and 3 are periodically transmitted to volatile memory storage device 220 from an external source, such as memory controller 202 or the central processing unit connected to memory controller 202. In such implementations, Thresholds 1, 2 or 3 may be dynamically changed or adjusted over time. For example, Thresholds 1, 2 or 3 may be dynamically changed or adjusted based upon input or preferences of a user. Thresholds 1, 2 or 3 may be dynamically changed or adjusted based upon other sensed factors such as the time of day, the age of the volatile memory storage device or the like. For example, such thresholds may be dynamically changed or adjusted to a lower value at certain times of the day as compared to other times of the day.

Figure 5:
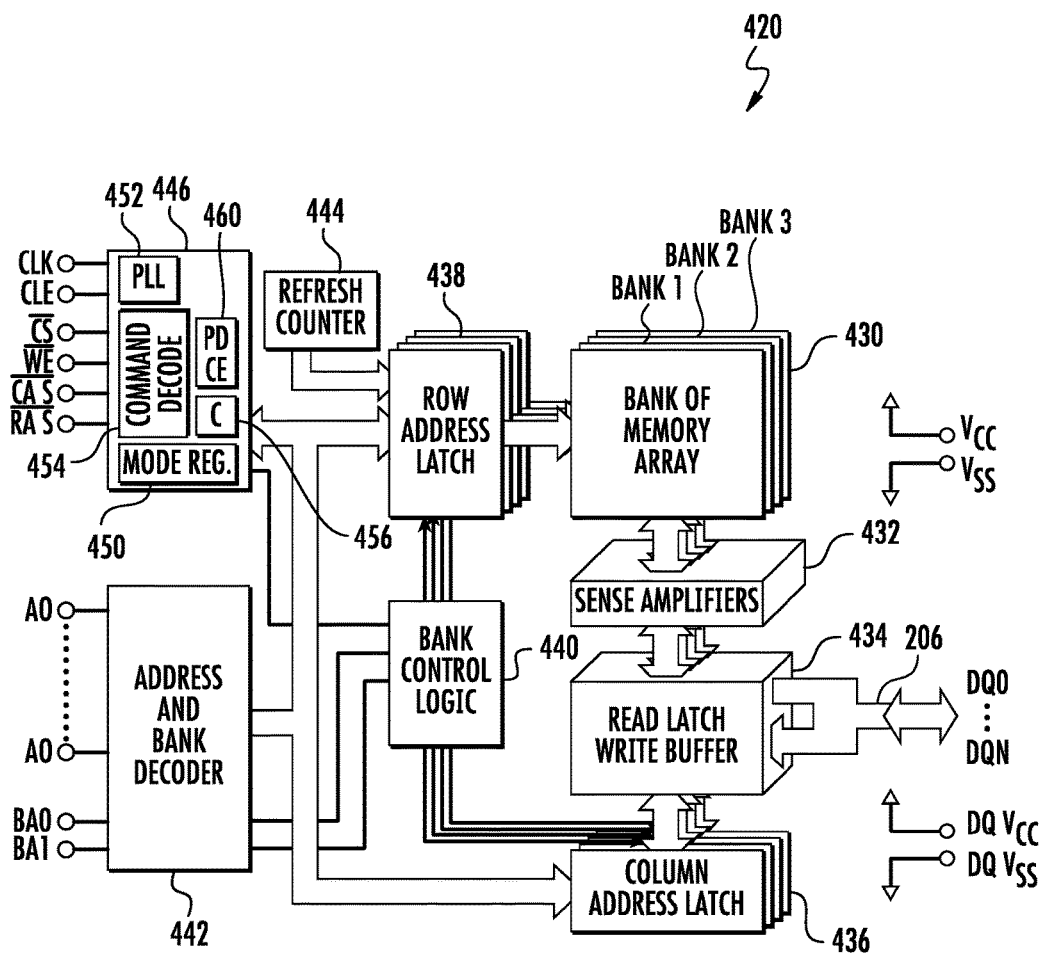
FIG. 5 is a schematic diagram of another example volatile memory device.

FIG. 5 is a schematic diagram of volatile memory device 420, another example of volatile memory device 20. Volatile memory device 420 may work in conjunction with memory controller 202, buses 204, 206 described above. Volatile memory device 420 comprises a dynamic random access memory device. In the example illustrated, volatile memory device 420 is illustrated as a multi-banked DRAM chip.

Volatile memory device 420 comprises memory array 430, sense amplifiers 432, read latch/write buffer 434, column address latch 436, row address latch 438, bank control logic 440, address and bank decoder 442, refresh counter 444 and control logic 446. Memory array 430 is similar to memory array 30 described above. In the example illustrated, memory array 430 comprises multiple banks. A memory bank is a logic unit of storage in memory array 430.

Sense amplifiers 432 comprise circuitry that are utilize when data is read from memory array 430. Sense amplifiers 432 sense low-amplitude signals from a bit line that represents a data bit stored in the memory and amplify the small voltages to recognizable logic levels for data interpretation by outside logic.

Read latch write buffer 434 comprises an electronic buffer for temporarily retaining data that is been read from memory array 430, waiting transmission via data bus 206 or retaining data to be written to memory array 430.

Column address latch 436 and row address latch 438 comprise the digital electronic logic circuits that receive and temporarily retain a column address and a row address, respectively. Bank control logic 440 comprises circuitry that controls which of the banks of memory array 430 are being accessed. Address and bank decoder 442 comprises circuitry that receives and decodes bank/address information received via address bus 204.

Refresh counter 444 comprises an internal clock of volatile memory device 420. Refresh counter 444 tracks time since a last refresh of data in memory 430. It comprises of a decay counter or other timing device establishing a refresh interval. Refresh timer electronics 236 tracks the time since the last refresh of memory array 430 and triggers a memory refresh cycle for memory array 430. In one implementation, the refreshing of memory array 430 may comprise a burst refresh. In other implementations, the refresh of memory array 430 may comprise a distributed refresh. In yet other implementations, other refresh protocols for memory array 430 may be employed.

Control logic 446 controls access to memory array 430 as well as other operations of volatile memory device 420. Control logic 446 comprises mode register 450, phase locked loop 452, command decoder 454, counter 456 and power down control element 460. Mode register 450 comprise a register storing various settings or modes for the volatile memory device 420. Phase locked loop 452 comprises electronics that synchronize the internal clocks of volatile memory device 420 with external clocks.

Command decoder 454 comprise electronics that manage access operations for memory array 430. In one implementation, command decode electronics 454 facilitate the sequencing of commands in accordance with a clock cycle time. Such sequencing may be based upon settings stored in mode register 450.

Counter 456 is similar to counter 40 and counter 240 described above. Counter 456 comprises a component, incorporated as part of memory device 420, that tracks a time or a lapse of time since the volatile memory device 420 last received a read or write command, such as a last time that device 420 received a read or write command from a memory controller. In one implementation, counter 456 comprises a decay counter which counts down from a predetermined value, control element 460 is triggered to initiate a lower power state in response to the decay counter counting down to a predetermined value, such as zero. In another implementation, counter 456 comprises an incremental counter which increases in value as time passes since receipt of a last axis command (read or write command) from a memory controller, wherein control element 460 is triggered to initiate a lower power state in response to the value of the counter meeting or surpassing a predefined threshold.

Power down control element 460 is similar to power down control element 250 described above. In one implementation, power down control element 460, following instructions contained in a non-transient computer-readable medium, carries out method 100 described above with respect to FIG. 2.

In another implementation, power down control element 460, following instructions contained in a non-transient computer readable medium carries out method 300 described above with respect to FIG. 4. In one implementation, in Power State 3 of method 300 in FIG. 4, power down control element 250 outputs control signals to automatically rewrite any page in read latch write buffer 434 memory array 430 and subsequently deactivates read data latch write driver 434 to conserve power. In Power State 2 of method 300 in FIG. 4, power down control element 460 outputs control signals that automatically deactivate an external clock interface, phase locked loop 452 to conserve power, wherein the volatile memory device 220 relies on its own internal clock or counters for triggering or monitoring refresh cycles. In Power State 1 of method 300 in FIG. 4, power down control element 460 outputs control signals automatically deactivating refresh counter 444 of the volatile memory device 220 to conserve power. In yet other implementations, the control element 50 may automatically initiate other power saving protocols for volatile memory device 20 in response to the counter signal.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A volatile memory device comprising:
   a memory array of volatile charge storage cells;
   a counter to track a time since the volatile memory device has received a read/write command;
   a control element to automatically change the volatile memory device to a lower power state based on the time tracked by the counter; and
   a buffer to store a page from the memory array;
   input/output circuitry, wherein the control element is to automatically rewrite the page from the buffer to the memory array and deactivate the buffer when automatically actuating the volatile memory device to the lower power state based on the time tracked by the counter.

2. The volatile memory device of claim 1 further comprising an external clock interface, wherein the control element is to automatically deactivate the external clock interface when automatically actuating the volatile memory device to the lower power state based on the time tracked by the counter.

3. The volatile memory device of claim 1 further comprising a refresh counter for a subset of the volatile charge storage cells, the refresh counter to track a time since a last refresh of the subset of the volatile charge storage cells, wherein the control element is to automatically deactivate the refresh counter when automatically actuating the volatile memory device to the lower power state based on the time tracked by the counter.

4. The volatile memory device of claim 1, wherein the control element is to (A) compare the counter signal to a first threshold and automatically change the volatile memory device to the lower power state in response to time tracked by the counter satisfying the first threshold and (B) is to compare the counter signal to a second threshold and automatically change the volatile memory device to a second lower power state, different than the first lower power state, in response to the time tracked by the counter satisfying the second threshold.

5. The volatile memory device of claim 1 further comprising an external clock interface, wherein the control element is to automatically deactivate the external clock interface when automatically actuating the volatile memory device to the second lower power state in response to the time tracked by the counter satisfying the second threshold.

6. The volatile memory device of claim 1, wherein the control element is to compare the counter signal to a third threshold and automatically change the volatile memory device to a third lower power state, different than the first lower power state and the second lower power state, in response to the time tracked by the counter satisfying the third threshold.

7. The volatile memory device of claim 1, wherein the control element is to automatically exit the lower power state in response to receiving a read/write command.

8. The volatile memory device of claim 1, wherein the changing of the volatile memories device to a lower power state is based upon a comparison of the time tracked by the counter to a threshold and wherein the threshold is dynamically adjustable.

9. A storage system comprising:
   a memory controller;
   a volatile memory device;
   a data bus connecting the memory controller and the memory device; and
   a command/address bus connecting the memory controller in the memory device, wherein the volatile memory device comprises:
   a memory array of volatile charge storage cells;
   a counter to track a time since the volatile memory device has received a read/write command;
   a control element to automatically change the volatile memory device to a lower power state based on a signal from the counter and
   a buffer to store a page from the memory array;
   input/output circuitry, wherein the control element is to automatically rewrite the page from the buffer to the memory array and deactivate the buffer when automatically actuating the volatile memory device to the lower power state based on the time tracked by the counter.

10. The storage system of claim 9, wherein the volatile memory device comprises a dynamic random access type of memory.

11. The storage system of claim 9, further comprising an external clock interface, wherein the control element is to automatically deactivate the external clock interface when automatically actuating the volatile memory device to the lower power state based on the time tracked by the counter.

12. The storage system of claim 9, further comprising a refresh counter for a subset of the volatile charge storage cells, the refresh counter to track a time since a last refresh of the subset of the volatile charge storage cells, wherein the control element is to automatically deactivate the refresh counter when automatically actuating the volatile memory device to the lower power state based on the time tracked by the counter.

* * * * *